United States Patent
Kye et al.

(12) 
(10) Patent No.: US 6,555,274 B1
(45) Date of Patent: Apr. 29, 2003

(54) PUPIL FILTERING FOR A LITHOGRAPHIC TOOL

(76) Inventors: Jongwook Kye, 2947 Liberty Dr., Pleasanton, CA (US) 94566; Bruno M. La Fontaine, 356 Trenton Cir., Pleasanton, CA (US) 94566

(*) Notice: Subject to any disclaimer, the term of this patent is extended or adjusted under 35 U.S.C. 154(b) by 48 days.

(21) Appl. No.: 09/775,062

(22) Filed: Feb. 1, 2001

(51) Int. Cl.[7] ............................................. G03F 9/00
(52) U.S. Cl. .......................................................... 430/5
(58) Field of Search ...................... 430/5, 322; 359/559, 359/589, 590

(56) References Cited

U.S. PATENT DOCUMENTS 6,048,651 A * 4/2000 Brunner et al. ................ 430/5

* cited by examiner

*Primary Examiner*—S. Rosasco

(57) ABSTRACT

A mask or reticle is optimized for use in a lithographic system. The mask or reticle includes a substrate and a pupil filter pattern. The substrate includes an IC pattern representing at least one integrated circuit feature. The pupil filter pattern can enhance the resolution associated with the lithographic system.

20 Claims, 5 Drawing Sheets

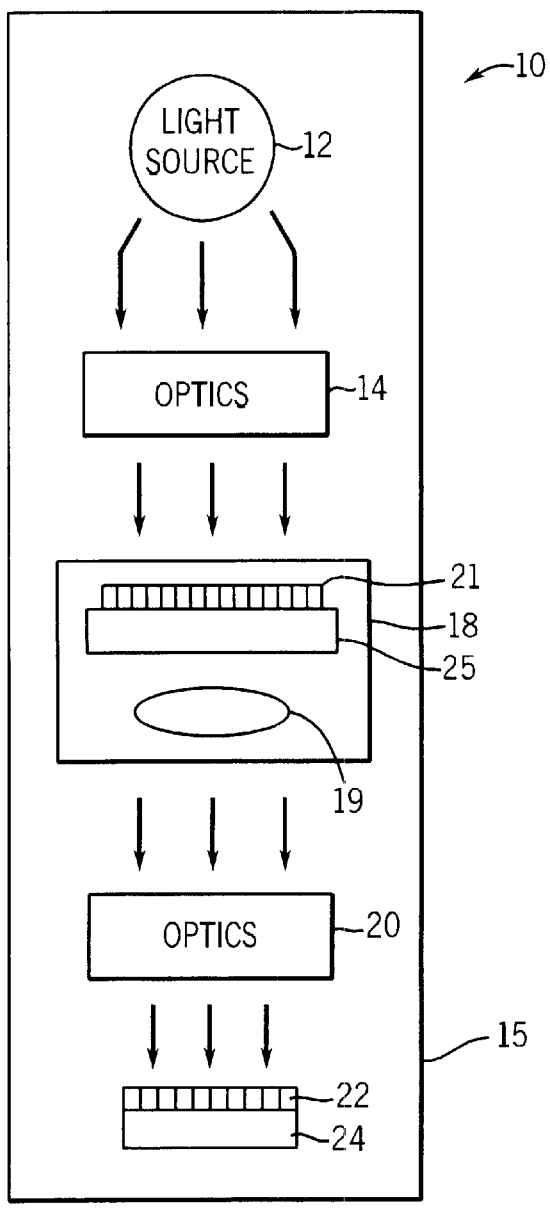
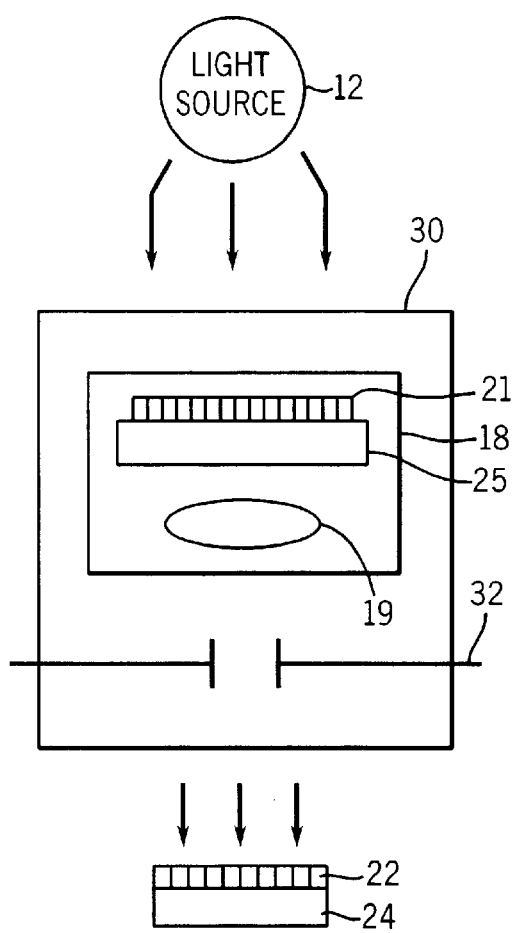
FIG. 1
FIG. 2

PUPIL FILTERING FOR A LITHOGRAPHIC TOOL

FIELD OF THE INVENTION

The present invention relates generally to integrated circuit fabrication equipment. More particularly, the present invention relates to integrated circuit fabrication system for and a method of correcting pupil errors. Even further, the present invention relates to a mask that includes a layer for pupil filtering in a photolithographic camera or stepper unit.

BACKGROUND OF THE INVENTION

The semiconductor or IC industry desires to manufacture integrated circuits (ICs) with higher and higher densities of devices on a smaller chip area to achieve greater functionality and to reduce manufacturing costs. This desire for large scale integration has led to a continued shrinking of circuit dimensions and device features.

The ability to reduce the size of structures, such as, gate lengths in field-effect transistors and the width of conductive lines, is driven by lithographic performance. In conventional commercial fabrication processes, lithographic systems, such as, photolithographic cameras or stepper units, expose a photoresist material to a pattern of radiation. The photoresist material is developed in accordance with the pattern of radiation to form a pattern of the photoresist material on a wafer. The wafer is processed in accordance with the pattern of photoresist material.

A conventional lithographic system or photolithographic machine can be a projection printing machine using refractive optics in a step-and-repeat projection method. Lithographic systems are sometimes called "steppers", which provide higher image resolution than other scanner-type aligners.

Conventional lithographic systems generally include a light source configured to provide radiation or light at one or more wavelengths. For example, the light source may include an excimer laser producing radiation at a wavelength of 248 nm, 193 nm, and/or 157 nm. The excimer laser can use a KrF source, a ArF source, a $F_2$ source, etc. The lithographic systems can further include a first lens assembly, a mask, and a second lens assembly. The radiation is provided from the light source through the first lens assembly, through the mask, through the second lens assembly to a semiconductor wafer having a layer of photoresist material.

The first lens assembly can be a condenser lens, and the second assembly can be an objective lens. The radiation can be light, such as ultraviolet light, vacuum ultraviolet (VUV) light, and deep ultraviolet (DUV) light. In alternative systems, the radiation can be x-ray radiation, e-beam radiation, extreme ultraviolet (EUV) light, etc.

As described above, conventional lithographic systems can utilize multiple optical elements to focus and direct light to the semiconductor wafer. Generally, the multiple optical elements (e.g., the first and second lens assemblies) can be considered as a single equivalent lens. The pupil of the lithographic system refers to the equivalent lens. The size of the pupil is the diameter of the equivalent lens, and the location of the pupil is the location of the plane of the equivalent lens. The pupil is utilized to mathematically model image formation by the optical elements of the lithographic system.

Lens assemblies of conventional lithographic systems are susceptible to lens aberrations or errors. These errors result in errors in the wavefront that is used by the lithographic stepper unit to produce the image on the wafer. As light passes through the first lens assembly and the second lens assembly, an imperfection in either lens assembly can locally increase or decrease the finite optical path. These imperfections can result in placement errors in the lithographic pattern. These errors are particularly problematic as sizes of lithographic features become smaller.

Accordingly, the pupil of the conventional lithographic system is often tested to determine at which locations errors are introduced into the pupil plane. Heretofore, the pupil of the conventional lithographic systems are probed or tested before installation (e.g., off-line) of the lithographic system by a laser interferometer or by overlay measurement tools. A pupil filter is employed to correct the pupil errors and enhance resolution. The pupil filter is generally inserted within the lens assemblies.

U.S. Pat. No. 6,115,108 discloses a projection-type lithographic system incorporating an illumination modification filter. The illumination modification filter includes a number of distinct illumination filtering zones, wherein each zone is operable to provide a distinct and unique illumination scheme.

A simplified exemplary filter having only three such illumination modification zones is illustrated in U.S. Pat. No. 6,115,108. A first zone of the filter is a pupil filter which inverts or otherwise varies the phase of light which passes through a central, circular region with respect to the phase of the light which passes through an annular region surrounding the inner, circular region. As is well-known by those skilled in the art, such a phase inversion may be provided in either a continuous or step-wise fashion. The pupil filter is constructed by forming a transparent dielectric film over the central region, wherein the thickness of the film may be controlled to provide the desired phase variation.

A second zone of the filter illustrates another exemplary pupil filter, wherein an inner region exhibits a lower transmittance than an outer annular region via a light-absorbing layer formed in the inner region. The transmittance may be modified further by adjusting a radius of the inner region as well as its degree of transmittance. In so doing, a wide variation of illumination schemes may be effectuated therewith. As is well known by those skilled in the art, such a variable transmittance pupil filter may be formed by forming a light-absorbing material, such as a metal film, over the central region, wherein a thickness of the material may be controlled to vary its transmittance.

A third zone illustrates a uniform illumination pupil filter. Such a pupil filter is operable to allow all or some of the illumination light to transmit therethrough in a uniform fashion. Such a filter may be constructed with a uniform transparent plate or alternatively may have a uniform light-absorbing material thereon having a thickness which provides for a uniform illumination attenuation.

U.S. Pat. No. 5,863,712 discloses a pupil filter with variable amplitude transmittance. The pupil filter has a transparent substrate, a phase retarding layer, a translucent film, and an opaque stencil. The pupil filter is replaced or rotated during a number of exposures or during a single exposure. The amplitude of transmittance associated with the pupil filter can be set to prevent imperfect resolution of the lithographic system. However, the variable amplitude transmittance pupil filter is located within the projection lens assembly associated with the lithographic system.

Inserting, adjusting, or rotating pupil filters within lens assemblies is problematic due to the sensitivity of the lens assemblies. In commercial lithographic systems, the lens assembly can be the most sensitive part of the lithographic system. These lens assemblies must be precisely calibrated before commercial operation and are normally serviced by the equipment manufacturer. A pupil filter may even be permanently provided within the lens assembly and may not be adjustable by the IC fabricator. Accordingly, adjusting the lens assemblies to accommodate adjustments to pupil filters is expensive and increases the throughput associated with the lithographic equipment. Further, systems for manipulating the pupil filter within the lens assembly may not be practically available for mass fabrication of ICs.

Pupil filters frequently must be changed for each reticle or mask utilized by the photolithographic system. Each reticle or mask has a different optimum condition which requires a different pupil filter. Accordingly, pupil filtering has been somewhat impracticable for mass fabrication systems which utilize a large number of masks or reticles.

Thus, there is a need for a lithographic system that utilizes pupil filtering to increase resolution for mass production ICs. Further, there is a need for a lithographic system which provides pupil filtering optimized for the mask or reticle utilized by the system. Even further still, there is a need for a process or method of pupil filtering without entering or adjusting components within the lens assemblies. Even further still, there is a need for a reticle or mask that can provide pupil filtering.

SUMMARY OF THE INVENTION

An exemplary embodiment relates to a mask or reticle for use in a lithographic system. The mask or reticle includes a substrate. The substrate includes an integrated circuit (IC) pattern and a pupil filter pattern. The IC pattern represents at least one integrated circuit feature.

Another exemplary embodiment relates to a method of enhancing resolution of a lithographic system. The lithographic system includes a pupil. The method includes providing a mask or reticle having an IC pattern and providing a pupil filter pattern on the mask or reticle.

Still another exemplary embodiment relates to a lithographic system. The lithographic system is for use in integrated circuit (IC) fabrication. The lithographic system includes lens assemblies represented by a pupil. The lithographic system includes a mask means for patterning radiation according to an integrated circuit pattern and a pupil filter means for patterning radiation in accordance with a Fourier transform of the shape of the pupil.

BRIEF DESCRIPTION OF THE DRAWINGS

The present invention will hereafter be described with reference to the accompanying drawings, wherein like numerals denote like elements, and:

FIG. 1 is a general schematic block diagram of a lithographic system including lens assemblies and a reticle or mask, the reticle or mask of the lithographic system includes a pupil filter in accordance with an exemplary embodiment;

FIG. 2 is a general schematic block diagram of the lithographic system illustrated in FIG. 1, the block diagram of FIG. 2 includes a pupil representing the lens assemblies shown in FIG. 1;

FIG. 3 shows a pupil filter pattern for the lens assemblies of the lithographic system illustrated in FIG. 1 (the pupil illustrated in FIG. 2) in accordance with another exemplary embodiment;

FIG. 5 shows a pupil filter pattern for the lens assemblies of the lithographic system illustrated in FIG. 1 (the pupil illustrated in FIG. 2) in accordance with yet another exemplary embodiment;

FIG. 7 shows a pupil filter pattern for the lens assembly of the lithographic system illustrated in FIG. 1 (the pupil illustrated in FIG. 2) in accordance with a further exemplary embodiment;

FIG. 9 shows a pupil filter pattern for the lens assemblies of the lithographic system illustrated in FIG. 1 (the pupil illustrated in FIG. 2) in accordance with yet even another exemplary embodiment;

DETAILED DESCRIPTION OF THE PREFERRED EMBODIMENTS

Figure 3:
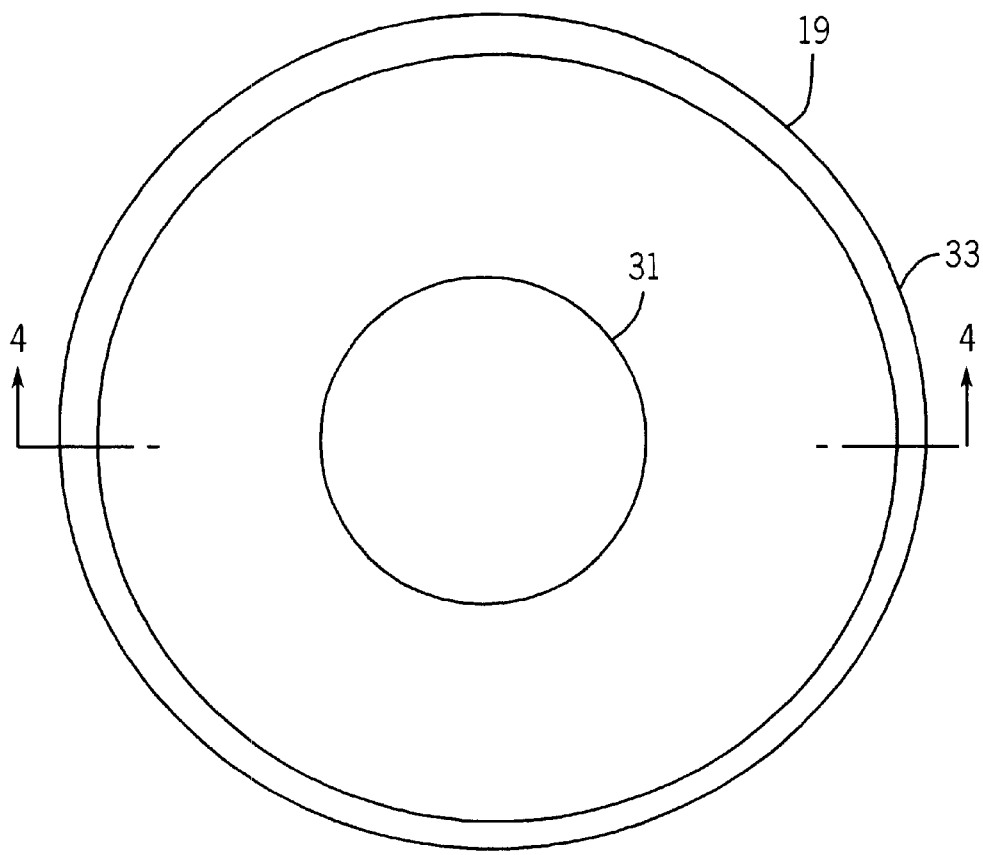
FIG. 3 is a top view schematic drawing of the reticle or mask marked in FIG. 1.

With reference to FIG. 1, a camera stepper unit or lithographic system 10 includes a reticle or mask 18 including a pupil filter pattern 19 and an integrated circuit (IC) pattern 21. Reticle or mask 18 is optimized to correct lens aberration errors within system 10. Lithographic system 10 can be any tool for use in integrated circuit (IC) fabrication which includes at least one lens assembly.

Lithographic system 10 includes a light source 12, a condenser lens assembly 14, and an objective lens assembly 20. Mask 18 is placed between lens assembly 14 and lens assembly 20. System 10 can be contained within a chamber 15. Lithographic system 10 is configured to provide radiation from light source 12 through lens assembly 14, through mask 18, and lens assembly 20 to a photoresist layer 22. An example of system 10 is a PAS 5500/xxx series machine manufactured by ASML. Other examples of system 10 include MICROSCAN DUV systems by Silicon Valley Group of USA or an XLS family microlithography system by Integrated Solutions, Inc. of Korea.

Photoresist layer 22 can be provided on a substrate 24. Substrate 24 can be an integrated circuit (IC) wafer, a semiconductive material, an insulative material, a conductive material, layers above any of the listed materials, or a base layer. Substrate 24 can be an industry standard silicon wafer. Substrate 24 is not described in a limiting fashion.

System 10 is designed to utilize radiation at a wavelength (λ) of i-line (365 nm) DUV (248 nm), VUV (193 nm) at a coherence level between 0.1 and 0.95 (pupil fill factor (PFF)). Light source 12 preferably provides light at a wavelength of i-line, DUV, VUV and at a coherence level of 0.2–0.85 when utilized to pattern IC wafers. Light source 12 can be any number of sources of electromagnetic radiation.

Light source 12 can be a laser light source that omits two wavelengths, such as, an argon laser. Alternatively, light source 12 can be an excimer laser, an ND:YAG laser, a frequency doubled ND:YAG laser, a Ti:saphhire laser; a He-Ne scanning laser, or other light source. Light source 12 can provide light in various wavelength ranges depending upon the technology of system 10.

Light provided from light source 12 is provided through mask 18 in accordance with the pattern on mask 18 to lens assembly 20. Lens assembly 20 provides the patterned light to photoresist layer 22. Photoresist layer 22 is selected to have photochemical reactions in response to the light from source 12. Photoresist layer 22 can be any conventional positive or negative resist material of any suitable thickness.

Mask 18 includes an integrated circuit pattern 21 on a substrate 25. Mask 18 also advantageously includes a pupil filter pattern 19. Integrated circuit pattern 21 corresponds to the pattern being formed in photoresist layer 22 on substrate 24. Pupil filter pattern 19 advantageously serves to provide a flexible resolution technique for lithographic system 10.

With reference to FIG. 2, lithographic system 10 is shown including an equivalent lens 30 representative of lens assemblies 14 and 20. The equivalent lens assembly 30 includes a pupil 32. Errors can be ascertained with respect to pupil 32 via the inspection process. The errors can be localized and characterized on pupil 32 so that appropriate corrective action can be taken. The errors (phase delays, etc.) on the wavefront associated with pupil 32 are manifested as an increase or decrease of the optical path from source 12 to layer 22.

Figure 4:
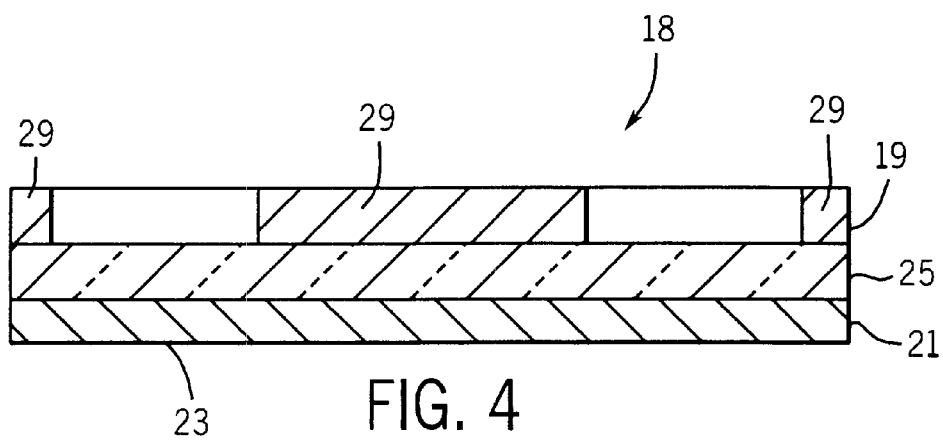
FIG. 4 is a more detailed schematic cross-sectional view about line 4—4 of FIG. 3 of the mask or reticle illustrated in FIG. 3, the mask or reticle includes an IC pattern and a pupil filter pattern in accordance with still another exemplary embodiment.

With reference to FIGS. 3 and 4, an exemplary IC pattern 21 and pupil filter pattern 19 for mask 18 are shown. Mask 18 can include a fused silica substrate 25 and an opaque or absorbing material 23 provided in pattern 21. In FIG. 4, absorbing material 23 is Cr patterned to form IC pattern 21 on a substrate 25. Mask 18 can also include anti-reflective coatings (ARCs) for reducing loss of light during lithography due to reflections. Mask 18 can also include phase shift or attenuation regions for increasing resolution. Pupil filter 19 pattern is made of transparent material at wavelength. It can be made of $SiO_2$ film. Thickness control of the phase of the pupil filter to get enhanced pattern resolution.

Substrate 25 of mask 18 can be a 6.35 millimeter, a 9 millimeter, or other standard thickness glass or fused silica material. Opaque material 23 for pattern 21 can be a layer which can have a thickness of 200–1000 Angstroms (preferably 500 Angstroms or less). Absorbing material 23 can include chromium, chromium oxide, or other absorbing materials. The materials associated with mask 18 are not discussed in a limiting fashion. Various design criteria including the wavelength of light associated with system 10 can affect the selection of materials for mask 18.

IC pattern 21 is shown in FIGS. 3 and 4 in exemplary fashion only. Pattern 21 is not drawn to scale. Pattern 21 can be in a variety of formats, depending upon the desired circuitry associated with substrate 24.

Mask 18 can also include transparent or partially absorbing material 29 patterned to form pupil filter pattern 19. Absorbing material 29 can be a selectively formed layer which can have a thickness of matching with phase (preferably π (180°) or π/2 (90°)). Layer 29 can include chromium, chromium oxide, or other absorbing materials.

Preferably, pattern 19 is provided on a top side of substrate 25, and pattern 21 is provided on a bottom side of substrate 25. Pattern 19 is the Fourier transform of the pupil filter pattern that would be provided conventionally at the pupil plane (i.e., inside equivalent lens assembly 30 at pupil 32) with respect to the IC pattern of mask 18. In other words, a conventional mask including a given IC pattern would require a specific or unique pupil filter to be inserted in the lens assembly to achieve the desired resolution enhancement. In the exemplary embodiment, a particular pattern representative of the Fourier transform of a given pupil filter conventionally provided at the pupil plane can be added to a conventional mask to form a mask or reticle, such as mask 18, that can achieve the desired resolution enhancement. The planes at which mask 18 and pupil 32 are located (i.e., a mask plane and a pupil plane, respectively) are conjugate planes. For example, pattern 19 can have a circular grating form.

Pupil filter pattern 19 can be embodied as a bull's-eye pattern including a circle 31 and an outside ring 33. If mask 18 is a six inch mask, pattern 19 can be a five to ten centimeter circular pattern. One exemplary size of circle 31 can be 5 cm and one exemplary size of ring 33 can be 10 cm. Alternatively, other circular gratings or patterns can be utilized as pupil filter pattern 19. For example, pattern 19 can include two or more rings similar to ring 33.

As shown, pupil filter pattern 19 advantageously allows pupil filtering to be flexibly applied based on the particular IC pattern on mask 18. Pupil filter pattern 19 can be designed for particular IC patterns 21 or masks 18. In this way, lens assemblies 14, 20 of system 10 do not need to be adjusted to provide changes to pupil filter patterns.

Absorbing materials 29 and 23 can be patterned by an imaging process. Each surface of substrate 25 of mask 18 can be processed separately, utilizing a resist coating step, a lithographic exposure step, and an etching step. Various types of lithographic or pattern generation tools can be utilized to provide patterns 19 and 21. The methods of providing patterns 19 and 21 are not discussed in a limiting fashion.

Figure 5:
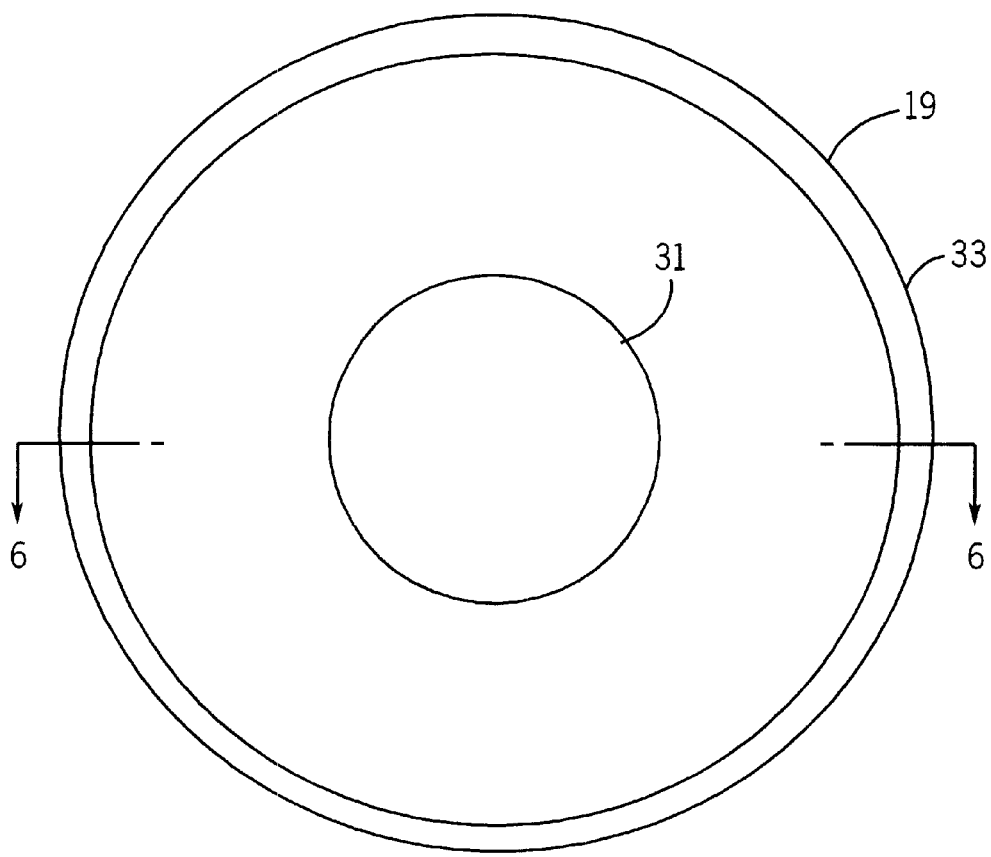
FIG. 5 is a bottom view schematic drawing of the mask or reticle illustrated in FIG. 1.
Figure 6:
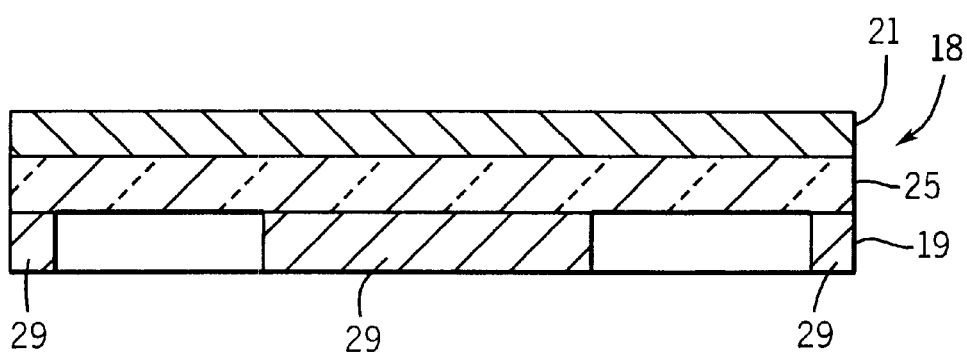
FIG. 6 is a more detailed schematic cross sectional view about line 6—6 of FIG. 5 of the mask or reticle illustrated in FIG. 5, the mask or reticle includes an IC pattern and a pupil pattern in accordance with yet still another exemplary embodiment.

With reference to FIGS. 5 and 6, mask 18 similar to mask 18 discussed with reference to FIGS. 3 and 4 can be manufactured by the same process. In FIGS. 5 and 6, mask 18 includes pupil filter pattern 19 on a bottom surface and IC pattern 21 on a top surface. Patterns 19 and 21 can be formed from opaque or absorbing material.

Figure 7:
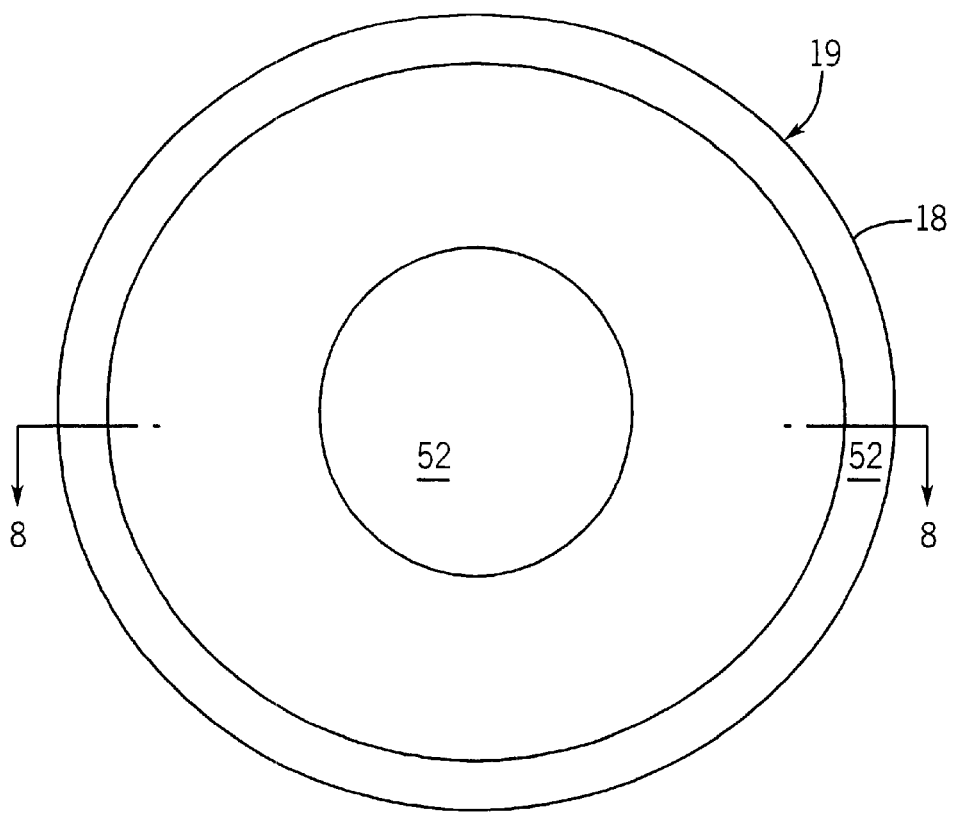
FIG. 7 is a bottom view schematic drawing of the mask or reticle illustrated in FIG. 1.
Figure 8:
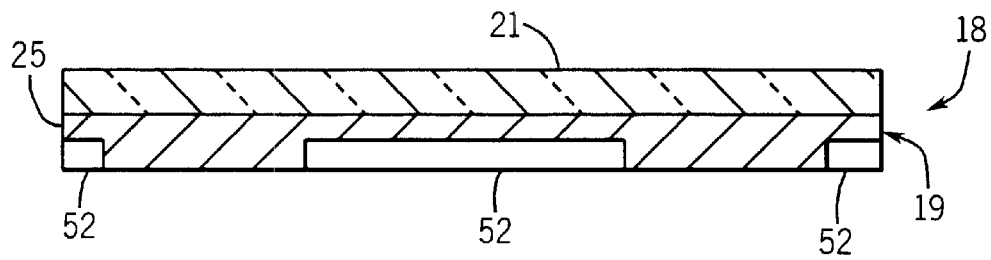
FIG. 8 is a more detailed schematic cross-sectional view about line 8—8 of FIG. 7 of the mask or reticle illustrated in FIG. 7, the mask or reticle includes an IC pattern and a pupil filter pattern in accordance with an even further exemplary embodiment.

With reference to FIGS. 7 and 8, mask 18 includes a pupil filter pattern 19 embodied as trenches 52 provided on a bottom side of substrate 25. Trenches 52 affect a phase delay in accordance with a Fourier transform of the pupil shape. A top side of substrate 25 includes IC pattern 21. In the alternative, trenches 52 can be provided on a top side of substrate 25, and pattern 21 can be provided on a bottom side of substrate 25.

Trenches 52 can be etched into substrate 25 in accordance with a number of processes. Preferably, trenches 52 have a depth of $\lambda/2(n-1)$ (λ: wavelength, n: index of refraction of material). Trenches 52 can be etched in a lithographic process utilizing wet chemical etching or dry etching. Specific examples of suitable wet chemical etching processes include HF etch processes. The depths of trenches 32 within substrate 25 determines the amount of phase shifting for a particular wavelength. For example, for light having a wavelength of 193 nm, a depth of approximately 193 (n=1.5) Angstroms is suitable to provide appropriate phase shifting. Other particular configurations are also contemplated.

In addition, pattern 19 can be configured between a combination of an opaque or absorbing material and trenches 52. The opaque material can be similar to opaque material 29 discussed with reference to FIGS. 3–6.

Trenches 52 can be fabricated in a conventional mask and etch process. For example, a photoresist material can be applied to substrate 25. The photoresist material is exposed to pattern radiation and developed leaving a pattern of photoresist in the form of the patterned radiation. Subsequently, substrate 25 is etched in accordance with the pattern of the photoresist.

Figure 9:
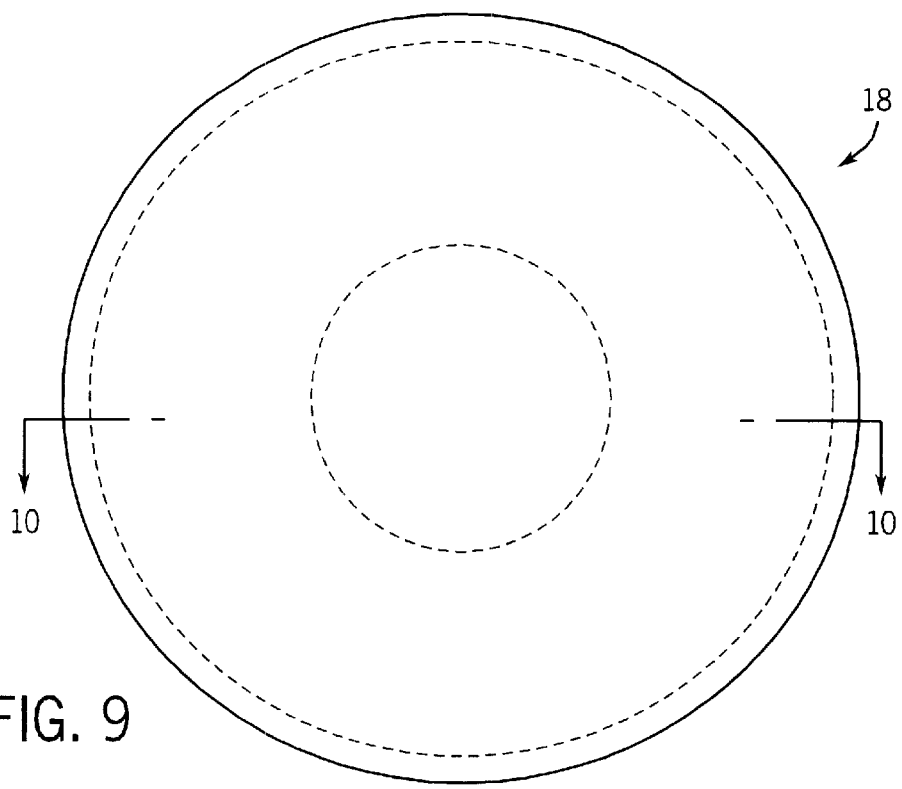
FIG. 9 is a bottom view schematic drawing of the mask or reticle illustrated in FIG. 1.
Figure 10:
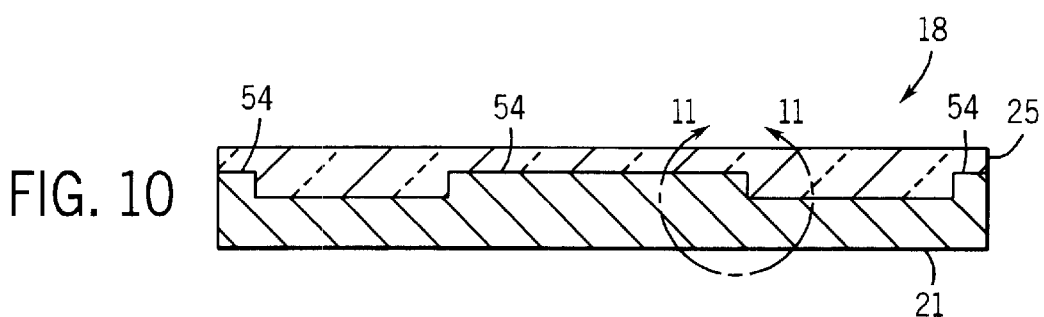
FIG. 10 is a more detailed schematic cross sectional view about line 10—10 of the mask or reticle illustrated in FIG. 9, the mask or reticle includes an IC pattern and a pupil filter pattern in accordance with yet even a further exemplary embodiment.
Figure 11:
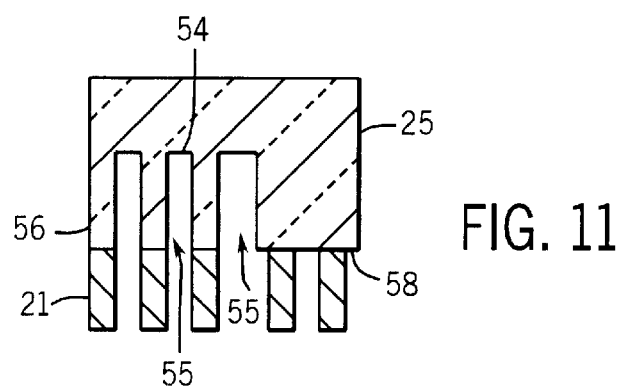
FIG. 11 is a more detailed cross sectional view of a portion encircled by a curve 11 of the mask or reticle illustrated in FIG. 10.

With reference to FIGS. 9–11, substrate 25 of mask 18 includes trenches 54 upon its bottom side. The bottom side of substrate 25 is further covered with IC pattern 21. Trenches 54 form filter pattern 19. Trenches 54 are similar to trenches 52 discussed above with reference to FIGS. 7–8. As shown in FIG. 11, IC pattern 21 in trench 54 is provided on islands 56 within trench 54. Outside of trench 54, pattern 21 is provided on bottom surface 58 of substrate 25. Trenches 54 serve to provide a phase delay as discussed with reference to FIGS. 7–8.

With reference to FIGS. 9–11, pupil filter pattern 19 is formed by etching trenches 54 into substrate 25 in a similar fashion to the formation of trenches 52 discussed above with reference to FIGS. 8–9. Substrate 25 can be etched by dry process. After etching to form trenches 54 including islands 56, pattern 21 can be selectively applied on the bottom surface of mask 18.

According to an alternative process, a layer of absorbing material associated with pattern 21 can be provided on bottom surface 58 of substrate 25. The layer of absorbing material is masked and etched in a conventional lithographic process to provide pattern 21.

After the provision of pattern 21, substrate 25 can be etched to form trenches 55 between islands 56 on a bottom surface of trenches 54 of substrate 25. Pattern 21 outside of trenches 54 are masked to prevent etching of surface 58 at those locations.

It is understood that while preferred embodiment and specific examples are given, they are for the purpose of illustration only and is not limited to the precise details disclosed. For example, although specific patterns are described, other types of light can be utilized. Various modifications may be made in the details within the scope and range of the equivalence of the claims without departing from what is claimed.

What is claimed is:

1. A mask or reticle for use in a lithographic system, the mask or reticle comprising:
   a substrate including an integrated circuit (IC) pattern representing at least one integrated circuit feature and a pupil filter pattern.
2. The mask or reticle of claim 1, wherein the IC pattern is on a first surface of the substrate and the pupil filter pattern is on a second surface of the substrate, the first surface being opposite the second surface.
3. The mask or reticle of claim 1, wherein the IC pattern is a first surface of the substrate and the pupil filter pattern is disposed over the IC pattern on the first surface.
4. The mask or reticle of claim 1, wherein the pupil pattern is on a first surface of the substrate and the IC pattern is over the pupil pattern on the first surface.
5. The mask or reticle of claim 1, wherein the pupil filter pattern is a Fourier transform of a shape of a pupil filter at a pupil plane associated with the lithographic system.
6. The mask or reticle of claim 1, wherein the IC pattern is any critical layer pattern.
7. The mask or reticle of claim 1, wherein the pupil pattern is a metal pattern.
8. The mask or reticle of claim 1, wherein the substrate is a quartz substrate.
9. A method of enhancing resolution of a lithographic system, the lithographic system including a pupil, the method comprising:
   providing a mask or reticle having an integrated circuit (IC) pattern; and
   providing a pupil filter pattern on the mask or reticle.
10. The method of claim 9, wherein the pupil filter pattern is a Fourier transform of a shape of a pupil filter at the pupil plane.
11. The method of claim 9, wherein the second providing step includes providing the pupil filter pattern by etching a dielectric layer on a surface of the mask or reticle.
12. The method of claim 9, wherein the mask or reticle includes an IC pattern formed by a chromium layer.
13. The method of claim 9, wherein the pupil filter pattern is etched into the mask or reticle.
14. The method of claim 9, wherein the pupil filter pattern includes a grating pattern or a bull's eye pattern.
15. A lithographic system for use in integrated circuit fabrication, the lithographic system including lens assemblies represented by a pupil, the lithographic system comprising:
   a mask means for patterning radiation according to an integrated circuit pattern; and
   a pupil filter means for patterning radiation in accordance with a Fourier transform of a hypothetical pupil filter located at a pupil plane.
16. The lithographic system of claim 15, wherein the pupil filter means is etched into a substrate of the mask means.
17. The lithographic system of claim 15, wherein the radiation is provided at a wavelength below 450 nm.
18. The lithographic system of claim 15, wherein the pupil filter means includes a bull's-eye pattern.
19. The lithographic system of claim 15, wherein the mask means includes a chromium or chromium oxide or MoSiON pattern.
20. The lithographic system of claim 15, wherein the pupil filter means is provided over the mask means.

* * * * *